(12) United States Patent
Liou et al.

(10) Patent No.: US 6,171,899 B1
(45) Date of Patent: Jan. 9, 2001

(54) METHOD FOR FABRICATING A CAPACITOR

(75) Inventors: Fu-Tai Liou, Hsinchu; Water Lur; Kuan-Cheng Su, both of Taipei; Juan-Yuan Wu, Hsinchu, all of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/267,535

(22) Filed: Mar. 12, 1999

(51) Int. Cl.[7] ............................................... H01L 21/8242
(52) U.S. Cl. ......................... 438/240; 438/250; 438/393
(58) Field of Search ................................. 438/3, 239, 240, 438/250, 253, 254, 381, 393, 396, 397

(56) References Cited

U.S. PATENT DOCUMENTS

| | | | |
|---|---|---|---|
| 5,624,864 | * 4/1997 | Arita et al. | 438/3 |
| 5,750,419 | * 5/1998 | Zafar | 438/3 |
| 5,943,583 | * 8/1999 | Ochiai | 438/396 |
| 6,022,774 | * 2/2000 | Kawai et al. | 438/240 |

* cited by examiner

Primary Examiner—Chandra Chaudhari
Assistant Examiner—Jack Chen
(74) Attorney, Agent, or Firm—Hickman, Coleman & Hughes, LLP

(57) ABSTRACT

A method for fabricating a capacitor. A first metal layer is formed on a provided substrate. A dielectric film is formed on the first metal layer. The dielectric film can be a monolayer structure or a multi-layer structure comprising various dielectric materials. A rapid thermal process (RTP), such as a rapid thermal annealing, or a plasma treatment is performed to enhance the quality of the dielectric film. A photolithography and etching process is performed to remove a part of the dielectric film and the first metal layer to expose a part of the inter-layer dielectric layer. The remaining first conductive layer is used as a lower electrode. A conventional interconnect process is performed on the exposed inter-layer dielectric layer and on the dielectric film. For example, a glue layer is formed on the exposed inter-layer dielectric layer and on the dielectric film. A second metal layer is formed on the glue layer. A photolithography and etching process is performed to remove a part of the second conductive layer. The second metal layer remaining on the inter-layer dielectric layer is used as a wiring line for interconnection. The glue layer remaining on the dielectric film is used as an upper electrode.

38 Claims, 2 Drawing Sheets

METHOD FOR FABRICATING A CAPACITOR

BACKGROUND OF THE INVENTION

1. Field of the Invention

The invention relates in general to a method for fabricating of semiconductor integrated circuits (ICs). and more particularly to a method for fabricating a capacitor.

2. Description of the Related Art

DRAM is a volatile memory, and the way to store digital signals is decided by charge or discharge of the capacitor in the DRAM. Therefore, when the power applied on the DRAM is turned off, the data stored in the memory cell completely disappears. One DRAM cell includes one field effect transistor (FET) and one capacitor. The capacitor is used to store the signals in the DRAM cell. If more charges can be stored in the capacitor, the capacitor has less interference when the data is sensed by the amplifier.

Mixed mode circuits in a semiconductor chip contain capacitors. At present, most capacitors are of the double-polysilicon capacitor (DPC) type as shown in FIG. 1. As shown in FIG. 1, a double-polysilicon capacitor 100 is a capacitor having an upper electrode 104 and a lower electrode 102, both fabricated from polysilicon material. There is a dielectric layer 106 between the upper electrode 104 and the lower electrode 102. N-type impurities, for example, can be doped into the polysilicon layer to increase its electrical conductivity. In general, the lower electrode 102 of the double-polysilicon capacitor 100 is connected to a ground terminal while the upper electrode 104 is connected to a negative bias voltage $V_{bias}$. Hence, when the capacitor 100 is being charged, holes within the polysilicon lower electrode 102 migrate to a region on the upper surface of the lower electrode due to the negative bias voltage $V_{bias}$. These holes compensate for the N-type impurities originally doped inside the polysilicon electrode 102. Consequently, a depletion region 108 is formed on the upper surface of the electrode 102, thus forming an additional dielectric layer. In other words, an additional dielectric layer is formed over the original dielectric layer 106, thereby thickening the overall dielectric layer and reducing the charge storage capacity of the capacitor. Furthermore, capacitance of the capacitor is unstable due to some minor fluctuation of the negative bias voltage $V_{bias}$ too.

In prior art, metal capacitors, which can prevent a depletion region from forming in a double-poly capacitor, are provided. One of the metal capacitors uses interconnect metal layers as an upper electrode and a lower electrode and uses an inter-metal dielectric layer as the dielectric film for a capacitor. Interconnect metal, inter-metal dielectric and interconnect metal constitute a similar capacitor structure, which is used as a parasitic metal capacitor. However, when the inter-metal dielectric layer is used to isolate two metal layers so that the inter-metal dielectric layer is thick, the dielectric film of a capacitor is thicker and the capacitance is less. The capacitance of the parasitic metal capacitor with a thick inter-metal dielectric layer is thus limited. If the parasitic metal capacitor requires a capacitance the same as that of a conventional capacitor, the parasitic metal capacitor needs a large area because the capacitance increases according to the dielectric area.

SUMMARY OF THE INVENTION

The invention provides a method for fabricating a capacitor. A first metal layer is formed on a provided substrate. A dielectric film is formed on the first metal layer. The dielectric film can be a mono-layer structure or a multi-layer structure comprising various dielectric materials. A rapid thermal process (RTP), such as a rapid thermal annealing, or a plasma treatment is performed to enhance the quality of the dielectric film. A photolithography and etching process is performed to remove a part of the dielectric film and the first metal layer to expose a part of the inter-layer dielectric layer. The remaining first conductive layer is used as a lower electrode. A conventional interconnect process is performed on the exposed inter-layer dielectric layer and on the dielectric film. For example, a glue layer is formed on the exposed inter-layer dielectric layer and on the dielectric film. A second metal layer is formed on the glue layer. A photolithography and etching process is performed to remove a part of the second conductive layer. The second metal layer remaining on the inter-layer dielectric layer is used as a wiring line for interconnection. The glue layer remaining on the dielectric film is used as an upper electrode.

In the invention, a first metal layer and a dielectric film are formed on an inter-layer dielectric layer before performing a conventional interconnect process. The first metal layer is defined as a lower electrode of a capacitor. A second metal layer and a glue layer are provided and defined such that a part of the glue layer is used as an upper electrode of the capacitor and a part of the second metal layer is used as a wiring line for interconnection. The dielectric film between the lower electrode and the upper electrode is thin and is of good quality. The capacitance of the capacitor is thus higher than a conventional parasitic metal capacitor.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
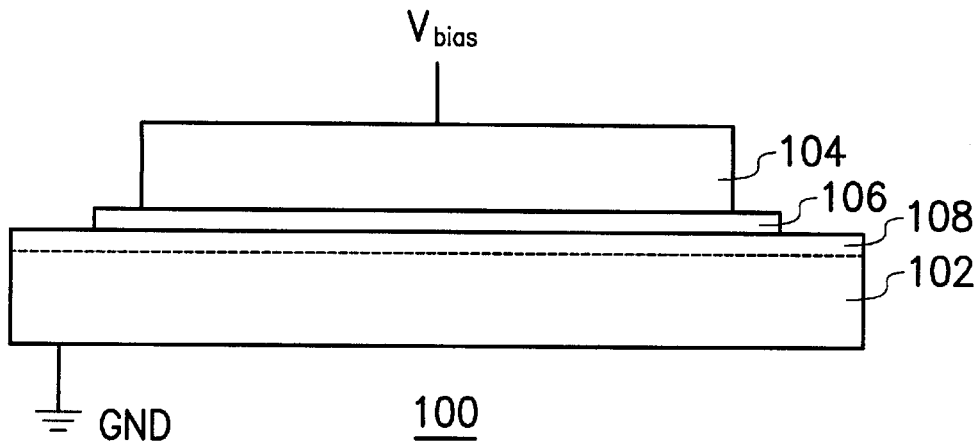
FIG. 1 is a schematic, cross-sectional view of a conventional double-polysilicon type of capacitor.
Figure 2A:
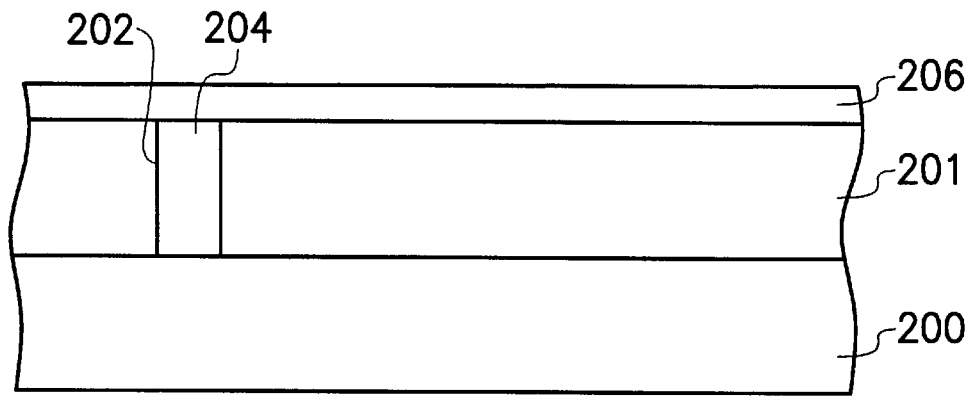
FIGS. 2A to 2D are schematic, cross-sectional views showing process steps of one preferred embodiment of the method for fabricating a capacitor.

FIG. 2A shows a schematic, cross-sectional view of an inter-layer dielectric layer 201 with a contact opening 202 therein. A metal plug 204 fills the contact opening 202. The metal plug 204 may be formed from a variety of materials, such as tungsten, aluminum, aluminum alloyed with silicon or copper, copper, alloys including copper and multilayer structures including comparatively inexpensive metals and more expensive metals such as the refractory metals. The inter-layer dielectric layer 201 lies over a substrate 200, which may contain a variety of elements, including, for example, transistors, diodes, and other semiconductor elements (not shown) as are well known in the art. The substrate 200 may also include other metal interconnect layers.

A first metal layer 206 as a lower electrode is formed on the inter-layer dielectric layer 201. The first metal layer 206 may comprise materials which still maintain good conductivity after a thermal cycle process is performed at up to 750° C. Preferred materials of the first metal layer 206 comprise titanium nitride (TiN), titanium (Ti), molybdenum (Mo), tungsten (W), hafnium nitride (HfN), zirconium nitride (ZrN), tantalum nitride (TaN) and niobium nitride (NbN).

Figure 2B:
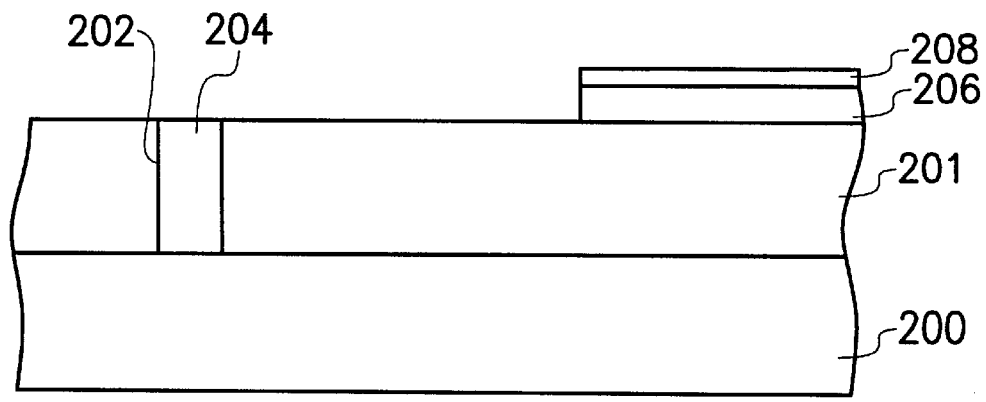

In FIG. 2B, a dielectric film 208 is formed on the first metal layer 206. The dielectric film may comprise a silicon oxide layer or a stacked layer comprising silicon oxide and silicon nitride, such as a silicon oxide/silicon nitride layer (ON layer) or a silicon oxide/silicon nitride/silicon oxide layer (ONO layer). Silicon oxide of the dielectric film 208 is formed by, for example, plasma enhanced chemical vapor deposition (PECVD), high density plasma CVD (HDPCVD), atmospheric pressure CVD (APCVD) or sub-atmospheric pressure CVD (SACVD). The APCVD and the SACVD are performed at a low temperature of about 300–550° C.

If the dielectric film 208 comprises silicon oxide and silicon nitride such as the ON layer or the ONO layer, the silicon oxide is formed in the same way described above and the silicon nitride is formed by, for example, PECVD or HDPCVD.

In order to enhance quality of the dielectric film 208, a rapid thermal process, such as a rapid thermal annealing, or a plasma treatment step may be performed on the dielectric film 208. The rapid thermal annealing is performed at a temperature of about 750° C. or less. The gas used in the rapid thermal annealing can be selected from a group comprising nitrogen monoxide ($N_2O$), oxygen ($O_2$), nitrogen ($N_2$) or a mixture gas at least comprising one of the gases described above. The plasma treatment step is performed at a temperature of about 500° C. or less. The gas used in the plasma treatment step can be selected from a group comprising nitrogen monoxide ($N_2O$), oxygen ($O_2$), nitrogen ($N_2$) or a mixture gas at least comprising one of the gases described above.

It should be noted that if the dielectric film 208 only comprises silicon oxide and is formed by PECVD, the dielectric film 208 structure is incompact. Since the dielectric film 208 of a capacitor is thin, current leakage occurs while operating the capacitor. It is necessary to perform a thermal process or a plasma treatment to enhance quality of the silicon oxide formed by PECVD. If the dielectric film 208 comprises silicon oxide formed by other methods or comprises silicon oxide and silicon nitride, the thermal process or the plasma treatment is alternatively performed on each material of the dielectric film 208 according to a required capacitance for fabricating the capacitor.

After performing the thermal process or the plasma treatment on the dielectric film 208, a photolithography and etching process is performed to remove a part of the dielectric film 208 and the first metal layer 206 to expose a part of the inter-layer dielectric 201 and the metal plugs 204 as shown in FIG. 2B.

Figure 2C:
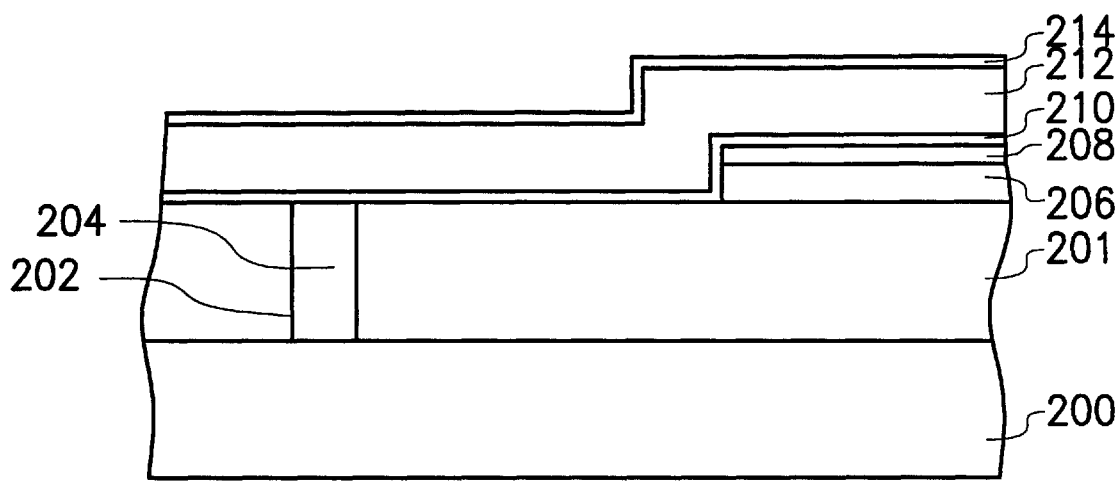

In FIG. 2C, a glue layer 210 comprising titanium/titanium nitride is formed over the inter-layer dielectric layer 201. A second metal layer 212 is formed on the glue layer 210. The glue layer 210 is used to enhance the adhesion between the second metal layer 212 and the metal plug 204. The second metal layer 212 may be formed from a variety of materials, such as aluminum, aluminum alloyed with silicon or copper, copper, alloys including copper and multilayer structures including comparatively inexpensive metals and more expensive metals such as the refractory metals.

Furthermore, reflectivity index of the second metal layer 212 is large so that exposure light is reflected by the second metal layer 212 during a photolithography process. The reflection causes misalignment. To avoid the misalignment, an anti-reflecting coating (ARC) layer 214 is formed on the second metal layer 212.

Figure 2D:
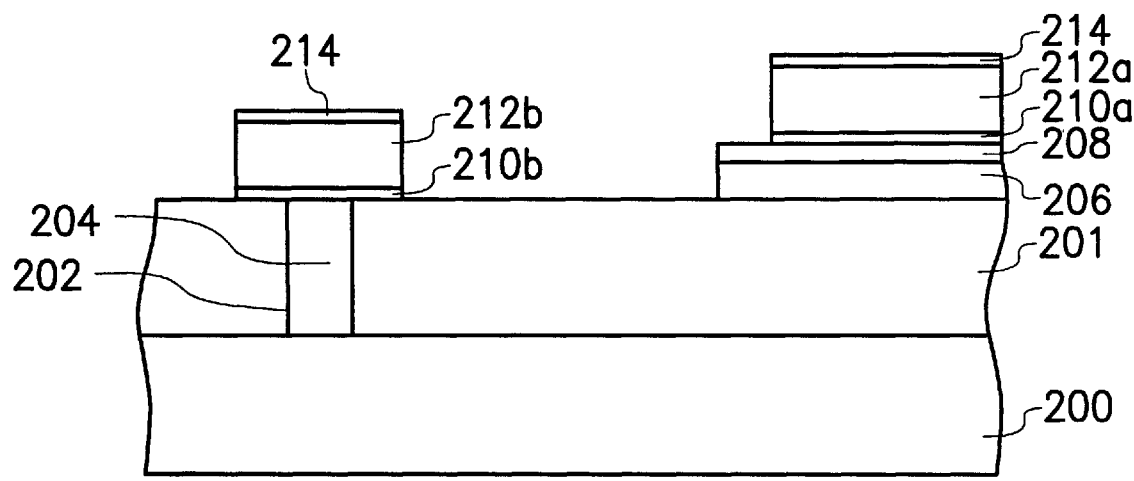

In FIG. 2D, a photolithography and etching process is performed to remove a part of the ARC layer 214, the second metal layer 212 and the glue layer 210. A part of the glue layer 210a remaining above the first metal layer 206 is used as an upper electrode. A part of the second metal layer 212b remaining above the metal plug 204 is used as a low-level wiring line for interconnection.

In following steps, an interconnection process is performed. For example, an inter-metal dielectric layer is formed over the structure shown in FIG. 2D. A high-level wiring line for interconnection is formed on the inter-metal dielectric layer. The high-level wiring line electrically couples with the low-level wiring line through vias. These steps are not the point of the invention and are well known for one skilled in the art. They are not described detail in the preferred embodiment.

In FIG. 2D, a part of the dielectric film 208 exposed after removing a part of the second metal layer 212 is not removed. If there are some wiring lines connecting to the first metal layer 208 according a design rule, the exposed dielectric film 210 is removed while removing the part of the second metal layer 212.

The method of the invention provides a first metal layer as a lower electrode on the inter-layer dielectric layer. Dielectric material used as a dielectric film for a capacitor is formed on the first metal layer. A thermal process or a plasma treatment is alternatively performed to enhance the quality of the dielectric film. A second metal layer is formed. A part of the second metal layer is used as an upper electrode. The other part of the second metal layer is used as a low-level wiring line for interconnection. In the invention, the dielectric film of the capacitor is provided by an additional step. Compared with a parasitic metal capacitor in a conventional method, the dielectric film of the invention is thinner than the inter-metal dielectric layer used as the dielectric film of the conventional parasitic metal capacitor. The capacitance of the capacitor of the invention is thus larger than the capacitance of the conventional capacitor. Furthermore, the lower electrode and the upper electrode of the invention are metal. A drawback of depletion region is thus prevented by the invention.

The dielectric film of the invention is a monolayer or a stacked layer. The monolayer layer comprises silicon oxide. The stacked layer comprises silicon oxide/silicon nitride (ON) or silicon oxide/silicon nitride/silicon oxide (ONO). If the dielectric film is silicon oxide formed by PECVD, a rapid thermal annealing process or a plasma treatment must be performed on the dielectric film. If the dielectric film is silicon oxide formed by other methods or a stacked layer, the rapid thermal annealing process or the plasma treatment is alternatively performed on the dielectric film. Using the ON layer as an example, a silicon oxide layer is formed on the first metal layer. A silicon nitride layer is formed on the silicon oxide layer. The rapid thermal annealing process or the plasma treatment is performed on the ON layer.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a capacitor, comprising the steps of:

providing a inter-layer dielectric layer with a metal plug therein;

forming a first metal layer on the inter-layer dielectric layer;

forming a dielectric film on the first metal layer;

performing a thermal process on the dielectric film;

removing a part of the dielectric film and the first metal layer to expose a part of the inter-layer dielectric layer comprising the metal plug, wherein a remaining first metal layer is used as a lower electrode;

forming a glue layer on the inter-layer dielectric layer and the first metal layer;

forming a second metal layer on the glue layer; and removing a part of the second metal layer and a part of the glue layer, wherein a part of a remaining glue layer positioned above the first metal layer is used as an upper electrode and the other part of a remaining second metal layer positioned above the metal plug is used as a wiring line.

2. The method according to claim 1, wherein the dielectric film is a silicon oxide layer.

3. The method according to claim 2, wherein the silicon oxide layer is formed by one of methods comprising PECVD, HDPCVD, APCVD and SACVD.

4. The method according to claim 1, wherein the dielectric film is a silicon oxide/silicon nitride (ON) layer.

5. The method according to claim 4, wherein silicon nitride of the ON layer is formed by one of methods comprising PECVD and HDPCVD.

6. The method according to claim 4, wherein silicon oxide of the ON layer is formed by one of methods comprising PECVD, HDPCVD, APCVD and SACVD.

7. The method according to claim 1, wherein the thermal process is selected from one of methods comprising a rapid thermal annealing and a plasma treatment.

8. The method according to claim 7, wherein the rapid annealing process is performed using a gas selected from a group comprising nitrogen monoxide ($N_2O$), oxygen ($O_2$) and nitrogen ($N_2$) at a temperature of about 750° C. or less.

9. The method according to claim 7, wherein the plasma treatment is performed using a gas selected from a group comprising nitrogen monoxide ($N_2O$), oxygen ($O_2$) and nitrogen ($N_2$) at a temperature of about 500° C. or less.

10. The method according to claim 1, wherein a material of the first metal layer is selected from a group comprising titanium nitride (TiN), titanium (Ti), molybdenum (Mo), tungsten (W), hafnium nitride (HfN), zirconium nitride (ZrN), tantalum nitride (TaN) and niobium nitride (NbN).

11. A method for fabricating a capacitor, comprising the steps of:

providing an inter-layer dielectric layer with a metal plug therein;

forming a first metal layer on the inter-layer dielectric layer;

forming a dielectric film on the first metal layer;

removing a part of the dielectric film and the first metal layer to expose a part of the inter-layer dielectric layer comprising the metal plug, wherein a remaining first metal layer is used as a lower electrode;

forming a glue layer on the inter-layer dielectric layer and the first metal layer;

forming a second metal layer on the glue layer; and removing a part of the second metal layer and a part of the glue layer, wherein a part of a remaining glue layer positioned above the first metal layer is used as an upper electrode and the other part of a remaining second metal layer positioned above the metal plug is used as a wiring line.

12. The method according to claim 11, wherein the step of forming the dielectric film on the first metal layer further comprises steps of:

forming a silicon oxide layer on the first metal layer; and forming a silicon nitride layer on the silicon oxide layer.

13. The method according to claim 12, wherein the silicon oxide layer is formed by one of methods comprising PECVD, HDPCVD, APCVD and SACVD.

14. The method according to claim 12, wherein the silicon nitride layer is formed by one of methods comprising PECVD and HDPCVD.

15. The method according to claim 12, wherein a thermal process is further performed after the step of forming the silicon oxide layer.

16. The method according to claim 15, wherein the thermal process is selected from one of methods comprising a rapid thermal annealing and a plasma treatment.

17. The method according to claim 16, wherein the rapid annealing process is performed using a gas selected from a group consisting of nitrogen monoxide ($N_2O$), oxygen ($O_2$) and nitrogen ($N_2$) at a temperature of about 750° C. or less.

18. The method according to claim 16, wherein the plasma treatment is performed using a gas selected from a group consisting of nitrogen monoxide ($N_2O$), oxygen ($O_2$) and nitrogen ($N_2$) at a temperature of about 500° C. or less.

19. The method according to claim 12, wherein a thermal process is further performed after the step of forming the silicon nitride layer.

20. The method according to claim 19, wherein the thermal process is selected from one of methods comprising a rapid thermal annealing and a plasma treatment.

21. The method according to claim 20, wherein the rapid annealing process is performed using a gas selected from a group comprising nitrogen monoxide ($N_2O$), oxygen ($O_2$) and nitrogen ($N_2$) at a temperature of about 750° C. or less.

22. The method according to claim 20, wherein the plasma treatment is performed using a gas selected from a group consisting of nitrogen monoxide ($N_2O$), oxygen ($O_2$) and nitrogen ($N_2$) at a temperature of about 500° C. or less.

23. The method according to claim 11, wherein the step of forming the dielectric film on the first metal layer further comprises steps of:

forming a first silicon oxide layer on the first metal layer;

forming a silicon nitride layer on the silicon oxide layer; and forming a second silicon oxide layer on the silicon nitride layer.

24. The method according to claim 23, wherein the first silicon oxide layer is formed by one of methods comprising PECVD, HDPCVD, APCVD and SACVD.

25. The method according to claim 23, wherein the silicon nitride layer is formed by one of methods comprising PECVD and HDPCVD.

26. The method according to claim 23, wherein the second silicon oxide layer is formed by one of methods comprising PECVD, HDDPCVD, APCVD and SACVD.

27. The method according to claim 23, wherein a thermal process is further performed after the step of forming the first silicon oxide layer.

28. The method according to claim 27, wherein the thermal process is selected from one of methods comprising a rapid thermal annealing and a plasma treatment.

29. The method according to claim 28, wherein the rapid annealing process is performed using a gas selected from a group consisting of nitrogen monoxide ($N_2O$), oxygen ($O_2$) and nitrogen ($N_2$) at a temperature of about 750° C. or less.

30. The method according to claim 28, wherein the plasma treatment is performed using a gas selected from a group consisting of nitrogen monoxide ($N_2O$), oxygen ($O_2$) and nitrogen ($N_2$) at a temperature of about 500° C. or less.

31. The method according to claim 23, wherein a thermal process is further performed after the step of forming the silicon nitride layer.

32. The method according to claim 31, wherein the thermal process is selected from one of methods comprising a rapid thermal annealing and a plasma treatment.

33. The method according to claim 32, wherein the rapid annealing process is performed using a gas selected from a group consisting of nitrogen monoxide ($N_2O$), oxygen ($O_2$) and nitrogen ($N_2$) at a temperature of about 750° C. or less.

34. The method according to claim 32, wherein the plasma treatment is performed using a gas selected from a group consisting of nitrogen monoxide ($N_2O$), oxygen ($O_2$) and nitrogen ($N_2$) at a temperature of about 500° C. or less.

35. The method according to claim 23, wherein a thermal process is further performed after the step of forming the second silicon oxide layer.

36. The method according to claim 35, wherein the thermal process is selected from one of methods comprising a rapid thermal annealing and a plasma treatment.

37. The method according to claim 36, wherein the rapid annealing process is performed using a gas selected from a group comprising nitrogen monoxide ($N_2O$), oxygen ($O_2$) and nitrogen ($N_2$) at a temperature of about 750° C. or less.

38. The method according to claim 36, wherein the plasma treatment is performed using a gas selected from a group comprising nitrogen monoxide ($N_2O$), oxygen ($O_2$) and nitrogen ($N_2$) at a temperature of about 500° C. or less.

* * * * *